(12) United States Patent
Matsushima et al.

(10) Patent No.: US 12,109,597 B2
(45) Date of Patent: Oct. 8, 2024

(54) SUBSTRATE TREATMENT DEVICE (71) Applicant: Shibaura Mechatronics Corporation, Yokohama (JP)

(72) Inventors: Daisuke Matsushima, Yokohama (JP); Kensuke Demura, Yokohama (JP); Satoshi Nakamura, Yokohama (JP); Masaya Kamiya, Yokohama (JP); Minami Nakamura, Yokohama (JP)

(73) Assignee: SHIBAURA MECHATRONICS CORPORATION, Kanagawa (JP)

(*) Notice: Subject to any disclaimer, the term of this patent is extended or adjusted under 35 U.S.C. 154(b) by 188 days.

(21) Appl. No.: 17/230,152

(22) Filed: Apr. 14, 2021

(65) Prior Publication Data

US 2021/0323036 A1 Oct. 21, 2021

(30) Foreign Application Priority Data

Apr. 15, 2020 (JP) .................................. 2020-072771
Jan. 15, 2021 (JP) .................................. 2021-004935
Apr. 8, 2021 (JP) .................................. 2021-065606

(51) Int. Cl.
*B08B 7/00* (2006.01)
*B08B 3/04* (2006.01)
(Continued)

(52) U.S. Cl.
CPC ............ *B08B 7/0014* (2013.01); *B08B 3/041* (2013.01); *B08B 3/08* (2013.01); *B08B 3/10* (2013.01); *F25C 1/12* (2013.01); *H01L 21/67028* (2013.01)

(58) Field of Classification Search
CPC ................................ B08B 7/0092; B08B 3/10
See application file for complete search history.

(56) References Cited

U.S. PATENT DOCUMENTS

2002/0020432 A1* 2/2002 Chang ...................... B08B 3/08
257/E21.228
2006/0266382 A1* 11/2006 Matsubara ................ B08B 3/10
134/33
(Continued)

FOREIGN PATENT DOCUMENTS

JP 2007-134673 A 5/2007
JP 2018-026436 A 2/2018
(Continued)

*Primary Examiner* — Spencer E. Bell
*Assistant Examiner* — Omair Chaudhri
(74) *Attorney, Agent, or Firm* — Pearne & Gordon LLP (57) ABSTRACT

According to one embodiment, a substrate treatment device includes a placement stand configured to rotate the substrate, a cooling part configured to supply a cooling gas into a space between the placement stand and the substrate, a first liquid supplier configured to supply a first liquid on a surface of the substrate, a second liquid supplier configured to supply a second liquid on the surface, and a controller controlling rotation of the substrate, supply of the cooling gas, the first and second liquids. The controller performs a preliminary process of supplying the second liquid on the surface, and supplying the cooling gas into the space, a liquid film forming process by supplying the first liquid toward the surface after the preliminary process, a supercooling process of the liquid film on the surface, and a freezing process of at least a part of the liquid film on the surface.

8 Claims, 8 Drawing Sheets

(51) Int. Cl.
*B08B 3/08* (2006.01)
*B08B 3/10* (2006.01)
*F25C 1/12* (2006.01)
*H01L 21/67* (2006.01)

(56) References Cited

U.S. PATENT DOCUMENTS

| | | | | |
|---|---|---|---|---|
| 2007/0105242 | A1* | 5/2007 | Shiki | H01L 21/31133 257/E21.255 |
| 2007/0131246 | A1 | 6/2007 | Izumi | |
| 2008/0121252 | A1* | 5/2008 | Miya | B08B 7/0092 134/4 |
| 2012/0175819 | A1* | 7/2012 | Miya | H01L 21/02052 425/445 |
| 2013/0167877 | A1* | 7/2013 | Fujiwara | H01L 21/67051 134/105 |
| 2013/0333722 | A1* | 12/2013 | Tanaka | B08B 3/10 134/1 |
| 2015/0020850 | A1* | 1/2015 | Kato | B08B 3/10 134/4 |
| 2015/0020852 | A1* | 1/2015 | Kato | H01L 21/6715 134/30 |
| 2017/0178892 | A1* | 6/2017 | Sato | H01L 21/02041 |
| 2017/0213725 | A1* | 7/2017 | Kitagawa | B08B 7/0014 |
| 2018/0047559 | A1* | 2/2018 | Kamiya | H01L 21/67051 |
| 2018/0182645 | A1* | 6/2018 | Nakano | H01L 21/67051 |
| 2018/0272391 | A1* | 9/2018 | Sakurai | H01L 21/68735 |
| 2019/0091736 | A1* | 3/2019 | Okutani | B08B 3/08 |
| 2019/0176179 | A1* | 6/2019 | Yoshida | B08B 7/0014 |
| 2020/0001333 | A1* | 1/2020 | Otsuji | H01L 21/67028 |
| 2020/0078834 | A1* | 3/2020 | Tanabe | H01L 21/68764 |

FOREIGN PATENT DOCUMENTS

| | | | | |
|---|---|---|---|---|
| TW | 200723379 A | | 6/2007 | |
| WO | WO-2019146338 A1 | * | 8/2019 | B08B 3/02 |

\* cited by examiner

SUBSTRATE TREATMENT DEVICE

CROSS-REFERENCE TO RELATED APPLICATIONS

This application is based upon and claims the benefit of priority from Japanese Patent Application No. 2020-072771, filed on Apr. 15, 2020, No. 2021-004935, filed on Jan. 15, 2021 and No. 2021-065606, filed on Apr. 8, 2021; the entire contents of which are incorporated herein by reference.

FIELD

Embodiments described herein relate generally to a substrate treatment device.

BACKGROUND

A freeze-cleaning method has been proposed as a method for removing contaminations such as particles adhering to the surface of a substrate such as an imprint template, a photolithography mask, and a semiconductor wafer.

In the freeze-cleaning method, for example, when pure water is used as the liquid used for cleaning, the pure water and cooling gas are first supplied to the surface of the rotated substrate. Next, the supply of pure water is stopped, and a part of the supplied pure water is discharged to form a water film on the surface of the substrate. The water film is frozen by the cooling gas supplied to the substrate. When the water film freezes and an ice film is formed, contaminations such as particles are taken into the ice film and separated from the surface of the substrate. Next, pure water is supplied to the ice film to melt the ice film, and contaminations are removed from the surface of the substrate together with the pure water. Thereby, a removal ratio of the contaminations is improved.

Here, conductivity of the pure water is low. Therefore, when the pure water is supplied to the surface of the rotating substrate, static electricity is easily generated. On the other hand, a conductive pattern or elements insulating the conductive pattern may be formed on the surface of the substrate. Therefore, electrostatic breakdown may occur due to the generated static electricity. In addition, the chemical reaction caused by the static electricity may cause damage to the surface of the substrate and the pattern.

Therefore, it has been desired to develop a substrate treatment device capable of suppressing the generation of static electricity and improving the removal ratio of contaminations.

DETAILED DESCRIPTION

According to one embodiment, a substrate treatment device includes a placement stand configured to rotate the substrate, a cooling part configured to supply a cooling gas into a space between the placement stand and the substrate, a first liquid supplier configured to supply a first liquid on a surface of the substrate opposite to the placement stand side, a second liquid supplier configured to supply a second liquid on the surface of the substrate, the second liquid being more conductive than the first liquid, and a controller controlling rotation of the substrate, supply of the cooling gas, supply of the first liquid, and supply of the second liquid. The controller controls the supply of the cooling gas, the supply of the first liquid, and the supply of the second liquid to perform a preliminary process of supplying the second liquid on the surface of the substrate, and supplying the cooling gas into the space between the placement stand and the substrate, a liquid film forming process of forming a liquid film by supplying the first liquid toward the surface of the substrate after the preliminary process, a supercooling process of putting the liquid film on the surface of the substrate in a supercooled state, and a freezing process of freezing at least a part of the liquid film on the surface of the substrate.

Various embodiments are described below with reference to the accompanying drawings. In the specification and drawings, similar components are marked with like reference numerals, and a detailed description is omitted as appropriate.

The substrate 100 illustrated below can be, for example, a semiconductor wafer, an imprint template, a photolithography mask, a plate-like body used for MEMS (Micro Electro Mechanical Systems), or the like.

The surface of the substrate 100 may be formed with uneven portions that are patterns, or may be a substrate (for example, a so-called bulk substrate) before the uneven portions are formed. However, the application of the substrate treatment device 1 is not limited to the illustrated substrate 100.

Further, in the following, as an example, a case where the substrate 100 is a mask for photolithography will be described. When the substrate 100 is a mask for photolithography, the planar shape of the substrate 100 can be a substantially quadrangle.

Figure 1:
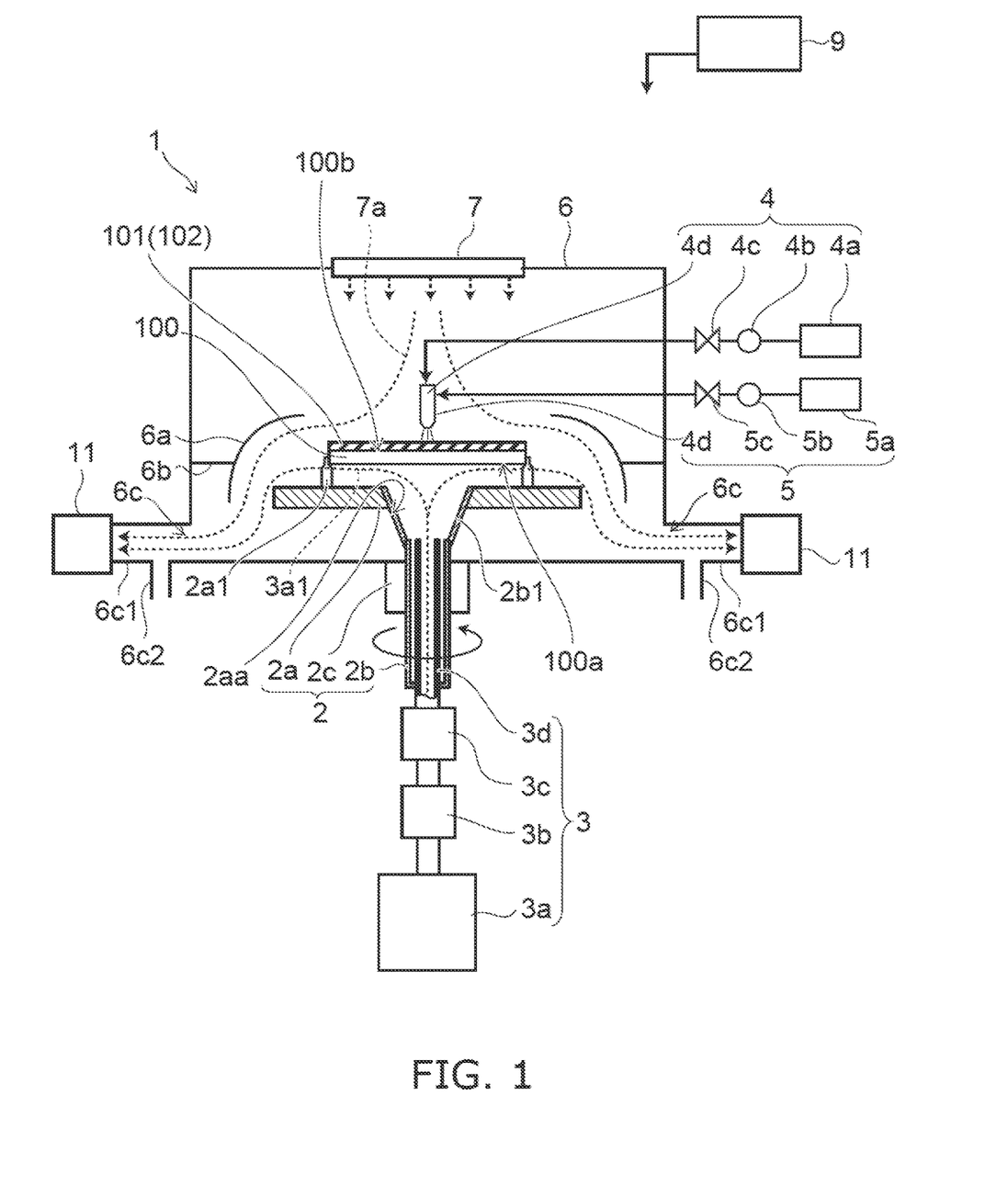
FIG. 1 is a schematic view for illustrating a substrate treatment device according to the embodiment.

FIG. 1 is a schematic view for illustrating a substrate treatment device 1 according to the embodiment.

Figure 2:
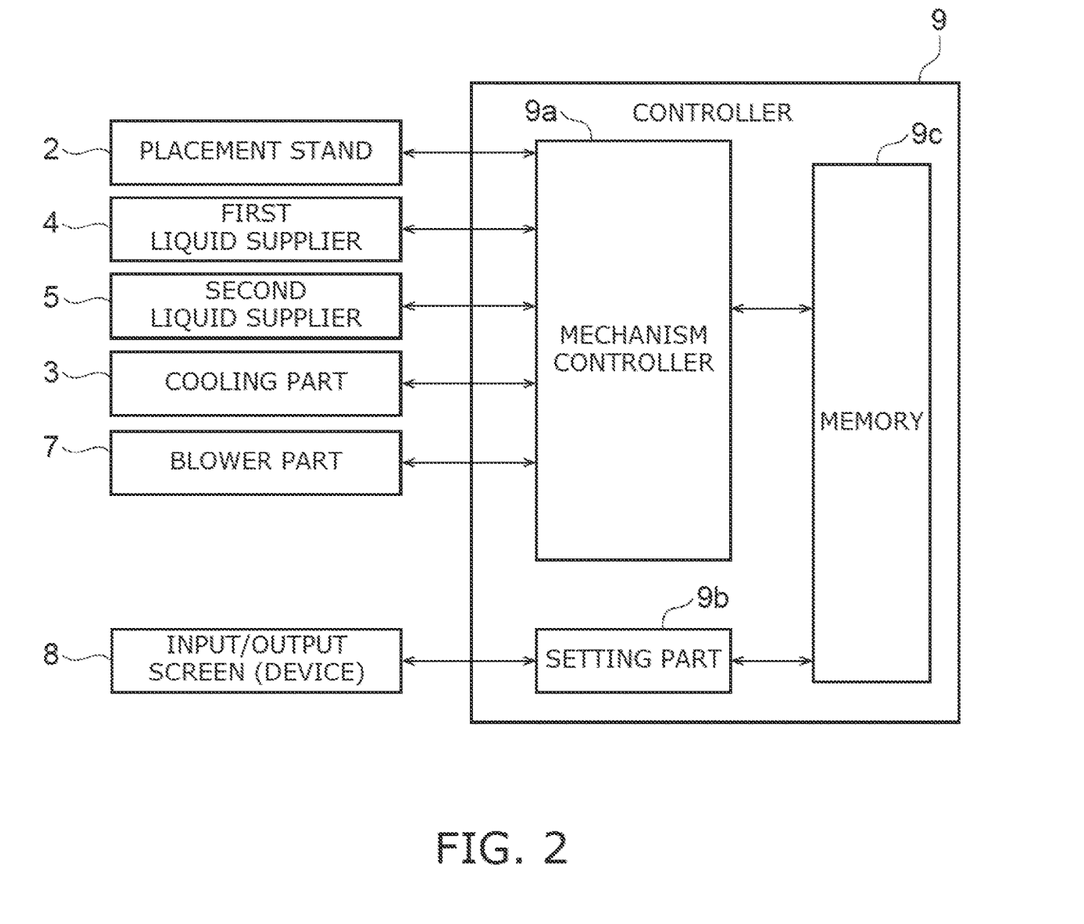
FIG. 2 is a schematic view for illustrating a controller of the substrate treatment device according to the embodiment.

FIG. 2 is a schematic view for illustrating a controller 9 of the substrate treatment device according to the embodiment.

As shown in FIG. 1, the substrate treatment device 1 includes a placement part 2, a cooling part 3, a first liquid supplier 4, a second liquid supplier 5, a housing 6, a blower part 7, and a controller 9, and an exhaust part 11. Further, as shown in FIG. 2, the controller 9 is provided with a mechanism controller 9a, a setting part 9b, and a memory 9c.

The placement part 2 includes a placement stand 2a, a rotation axis 2b, and a drive part 2c.

The placement stand 2a is rotatably provided inside the housing 6. The placement stand 2a has a plate shape. Multiple support portions 2a1 for supporting the substrate 100 are provided on one major surface of the placement stand 2a. When the substrate 100 is supported by the multiple support portions 2a1, the surface 100b (the surface on which the uneven portion is formed) of the substrate 100 faces a direction opposite to the placement stand 2a side.

The edges of the back surface 100a of the substrate 100 come into contact with the multiple support portions 2a1. The portion of the support portion 2a1 that comes into contact with the edge of the back surface 100a of the substrate 100 can be a tapered surface or an inclined surface.

Further, a hole 2aa piercing the thickness direction of the placement stand 2a is provided in the central portion of the placement stand 2a.

One end of the rotating shaft 2b is fitted into the hole 2aa of the placement stand 2a. The other end of the rotating shaft 2b is provided on the outside of the housing 6. The rotating shaft 2b is connected to the drive part 2c outside the housing 6.

The rotating shaft 2b has a tubular shape. A blowout portion 2b1 is provided at the end of the rotating shaft 2b on the placement stand 2a side. The blowout portion 2b1 is open to the surface of the placement stand 2a where multiple supporting portions 2a1 are provided. The opening-side end of the blowout portion 2b1 is connected to the inner wall of the hole 2aa. The opening of the blowout portion 2b1 faces the back surface 100a of the substrate 100 placed on the placement stand 2a.

The blowout portion 2b1 has a shape in which the cross-sectional area increases toward the placement stand 2a side (opening side). Therefore, the cross-sectional area of the hole inside the blowout portion 2b1 increases toward the placement stand 2a side (opening side). Although the case where the blowout portion 2b1 is provided at the tip of the rotating shaft 2b has been illustrated, the blowout portion 2b1 can also be provided at the tip of the cooling nozzle 3d described later. Further, the hole 2aa of the placement stand 2a can be used as the blowing portion 2b1.

If the blowing portion 2b1 is provided, the released cooling gas 3a1 can be supplied to a wider area of the back surface 100a of the substrate 100. In addition, the release rate of the cooling gas 3a1 can be reduced. Therefore, it is possible to suppress the substrate 100 from being partially cooled or the cooling rate of the substrate 100 from becoming too fast. As a result, it becomes easy to generate a supercooled state of the liquid 101 (corresponding to one example of the first liquid), which will be described later.

A cooling nozzle 3d is attached to the end of the rotating shaft 2b on the side opposite to the placement stand 2a side. A rotating shaft seal (not shown) is provided between the end of the rotating shaft 2b on the side opposite to the placement stand 2a side and the cooling nozzle 3d. Therefore, the end of the rotating shaft 2b on the side opposite to the placement stand 2a side is sealed so as to be airtight.

The drive part 2c is provided outside the housing 6. The drive part 2c is connected to the rotating shaft 2b. The drive part 2c can have a rotating device such as a motor. The rotational force of the drive part 2c is transmitted to the placement stand 2a via the rotation shaft 2b. Therefore, the drive part 2c can rotate the placement stand 2a and, in addition, the substrate 100 placed on the placement stand 2a.

Further, the drive part 2c can not only start and stop the rotation but also change the rotation per minute (rotation speed). The drive part 2c may be provided with a control motor such as a servo motor, for example.

The cooling part 3 supplies the cooling gas 3a1 to the space between the placement stand 2a and the back surface 100a of the substrate 100. The cooling part 3 includes a coolant part 3a, a filter 3b, a flow rate controller 3c, and a cooling nozzle 3d. The coolant part 3a, the filter 3b, and the flow rate controller 3c are provided outside the housing 6.

The coolant part 3a stores the coolant and generates the cooling gas 3a1. The coolant is a liquefied cooling gas 3a1. The cooling gas 3a1 is not particularly limited as long as it is a gas that does not easily react with the material of the substrate 100. The cooling gas 3a1 can be, for example, an inert gas such as nitrogen gas, helium gas, or argon gas.

The coolant part 3a includes a tank for storing the coolant and a vaporizer for vaporizing the coolant stored in the tank. The tank is provided with a cooling device for maintaining the temperature of the coolant. The vaporizer raises the temperature of the coolant to generate the cooling gas 3a1 from the coolant. For the vaporizer, for example, the outside air temperature can be used, or heating with a heat medium can be used. The temperature of the cooling gas 3a1 may be a temperature equal to or lower than the freezing point of the liquid 101, and can be, for example, $-170°$ C.

Although the case where the coolant part 3a generates the cooling gas 3a1 by vaporizing the coolant stored in the tank is illustrated, it is also possible to cool the nitrogen gas or the like with a chiller or the like to obtain the cooling gas 3a1. By doing so, the coolant portion can be simplified.

The filter 3b is connected to the coolant part 3a via a pipe. The filter 3b suppresses the outflow of contaminations such as particles included in the coolant to the substrate 100 side.

The flow rate controller 3c is connected to the filter 3b via a pipe. The flow rate controller 3c controls the flow rate of the cooling gas 3a1. The flow rate controller 3c can be, for example, an MFC (Mass Flow Controller) or the like. Further, the flow rate controller 3c may indirectly control the flow rate of the cooling gas 3a1 by controlling the supply pressure of the cooling gas 3a1. In this case, the flow rate controller 3c can be, for example, an APC (Auto Pressure Controller).

The temperature of the cooling gas 3a1 generated from the coolant in the coolant part 3a is substantially a predetermined temperature. Therefore, the flow rate controller 3c can control the flow rate of the cooling gas 3a1 to control the temperature of the substrate 100 and, in addition, the temperature of the liquid 101 on the surface 100b of the substrate 100. In this case, by controlling the flow rate of the cooling gas 3a1 by the flow rate controller 3c, the supercooled state of the liquid 101 can be generated in a supercooling process described later.

The cooling nozzle 3d has a tubular shape. One end of the cooling nozzle 3d is connected to the flow controller 3c. The other end of the cooling nozzle 3d is provided inside the rotating shaft 2b. The other end of the cooling nozzle 3d is located near the end of the blowout portion 2b1 opposite to the placement stand 2a side (opening side).

The cooling nozzle 3d supplies the cooling gas 3a1 whose flow rate is controlled by the flow rate controller 3c to the substrate 100. The cooling gas 3a1 discharged from the cooling nozzle 3d is directly supplied to the back surface 100a of the substrate 100 via the blowout portion 2b1.

The first liquid supplier 4 supplies the liquid 101 to the surface 100b of the substrate 100. As described later, the liquid 101 is preferably a liquid that does not easily react with the material of the substrate 100 and whose volume increases when frozen. The liquid 101 is preferably, for example, water (for example, pure water, ultrapure water, etc.), a liquid including water as a main component, or the like.

The liquid including water as a main component can be, for example, a mixed solution of water and alcohol, a mixed solution of water and an acidic solution, a mixed solution of water and an alkaline solution, and the like.

Since the surface tension can be reduced by using a mixed solution of water and alcohol, it becomes easy to supply the liquid 101 to the inside of the fine uneven portion formed on the surface 100b of the substrate 100.

If a mixed solution of water and an acidic solution is used, contaminations such as particles and resist residues adhering to the surface of the substrate 100 can be dissolved. For example, a mixed solution of water and sulfuric acid can dissolve contaminations made of resist or metal.

If a mixed solution of water and an alkaline solution is used, the zeta potential can be lowered, so that the contaminations separated from the surface 100b of the substrate 100 can be suppressed from reattaching to the surface 100b of the substrate 100.

However, if the amount of components other than water is too large, it becomes difficult to utilize the physical force associated with the increase in volume, so that the removal ratio of contaminations may decrease. Therefore, the concentration of components other than water is preferably 5 wt % or more and 30 wt % or less.

The first liquid supplier 4 includes a liquid storage part 4a, a supplier 4b, a flow rate controller 4c, and a liquid nozzle 4d. The liquid storage part 4a, the supplier 4b, and the flow rate controller 4c are provided outside the housing 6.

The liquid storage part 4a stores the liquid 101 described above. The liquid 101 is stored in the liquid storage part 4a at a temperature higher than the freezing point. The liquid 101 is stored at room temperature (20° C.), for example.

The supplier 4b is connected to the liquid storage part 4a via a pipe. The supplier 4b supplies the liquid 101 stored in the liquid storage part 4a toward the liquid nozzle 4d. The supplier 4b can be, for example, a pump having resistance to the liquid 101. Although the case where the supplier 4b is a pump has been illustrated, the supplier 4b is not limited to the pump. For example, the supplier 4b may supply gas to the inside of the liquid storage part 4a and pump the liquid 101 stored in the liquid storage part 4a.

The flow rate controller 4c is connected to the supplier 4b via a pipe. The flow rate controller 4c controls the flow rate of the liquid 101 supplied by the supplier 4b. The flow rate controller 4c can be, for example, a flow rate control valve. In addition, the flow rate controller 4c can also start and stop the supply of the liquid 101.

The liquid nozzle 4d is provided inside the housing 6. The liquid nozzle 4d has a tubular shape. One end of the liquid nozzle 4d is connected to the flow controller 4c via a pipe. The other end of the liquid nozzle 4d faces the surface 100b of the substrate 100 placed on the placement stand 2a. Therefore, the liquid 101 discharged from the liquid nozzle 4d is supplied to the surface 100b of the substrate 100.

The other end of the liquid nozzle 4d (the discharge port of the liquid 101) is faced substantially the center of the surface 100b of the substrate 100. The liquid 101 discharged from the liquid nozzle 4d spreads from substantially the center of the surface 100b of the substrate 100, and a liquid film having a substantially constant thickness is formed on the surface 100b of the substrate 100. In the following, the film of the liquid 101 formed on the surface 100b of the substrate 100 will be referred to as a liquid film.

The second liquid supplier 5 supplies the liquid 102 (corresponding to one example of the second liquid) to the surface 100b of the substrate 100. The second liquid supplier 5 includes a liquid storage part 5a, a supplier 5b, a flow rate controller 5c, and a liquid nozzle 4d.

The liquid 102 can be used in the preliminary process and the thawing process described later. Therefore, the liquid 102 is not particularly limited as long as it does not easily react with the material of the substrate 100 and does not easily remain on the surface 100b of the substrate 100 in the drying process described later.

Further, as described later, the liquid 102 is preferably a liquid having a higher conductivity than the liquid 101. The liquid 102 can be, for example, a liquid in which a gas that is ionized when dissolved is dissolved. The liquid in which the gas that is ionized when dissolved can be dissolved can be, for example, a liquid in which carbon dioxide gas or ammonia gas is dissolved. Further, the liquid 102 may be, for example, SC-1 (Standard Clean 1) having a low concentration diluted with pure water, choline (CHOLINE) aqueous solution, TMAH (Tetramethyl ammonium hydroxide) aqueous solution, or the like.

Further, the liquid 102 may be a mixed solution of the above-described liquid and a liquid 103 having surface tension smaller than the above-described liquid. The liquid 103 is, for example, a liquid containing surfactant, isopropyl alcohol (IPA), or the like.

The configuration of the second liquid supplier 5 can be, for example, the same as the configuration of the first liquid supplier 4. For example, the liquid storage part 5a can be the same as the liquid storage part 4a described above. The supplier 5b can be the same as the supplier 4b described above. The flow rate controller 5c can be the same as the flow rate controller 4c described above.

Further, since the liquid 102 is used in the preliminary process and the thawing process, the temperature of the liquid 102 can be higher than the freezing point of the liquid 101. Further, the temperature of the liquid 102 can be set to a temperature at which the frozen liquid 101 can be thawed. The temperature of the liquid 102 can be, for example, about room temperature (20° C.).

The housing 6 has a box shape. A cover 6a is provided inside the housing 6. The cover 6a receives the liquids 101 and 102 supplied to the substrate 100 and discharged to the outside of the substrate 100 by rotating the substrate 100. The cover 6a has a tubular shape. The vicinity of the end of the cover 6a opposite to the placement stand 2a side (near the upper end of the cover 6a) is bent toward the center of the cover 6a. Therefore, it is possible to easily capture the liquids 101 and 102 scattered above the substrate 100.

Further, a partition plate 6b is provided inside the housing 6. The partition plate 6b is provided between the outer surface of the cover 6a and the inner surface of the housing 6.

Multiple discharge ports 6c are provided on the bottom surface side of the housing 6. In the case of the housing 6 illustrated in FIG. 1, two discharge ports 6c are provided. The used cooling gas 3a1, air 7a, liquid 101, and liquid 102 are discharged from the discharge port 6c to the outside of the housing 6. An exhaust pipe 6c1 is connected to the discharge port 6c, and an exhaust part (pump) 11 for exhausting the used cooling gas 3a1 and air 7a is connected to the exhaust pipe 6c1. Further, a discharge pipe 6c2 for discharging the liquids 101 and 102 is connected to the discharge port 6c.

The discharge port 6c is provided below the substrate 100. Therefore, the cooling gas 3a1 is exhausted from the discharge port 6c to create a downflow flow. As a result, it is possible to prevent the particles from soaring.

In a plan view, the multiple discharge ports 6c are provided so as to be symmetrical with respect to the center of the housing 6. In this way, the exhaust direction of the cooling gas 3a1 becomes symmetrical with respect to the center of the housing 6. If the exhaust directions of the cooling gas 3a1 are symmetrical, the exhaust of the cooling gas 3a1 becomes smooth.

The blower part 7 is provided on the ceiling surface of the housing 6. The blower part 7 may be provided on the side surface of the housing 6 as long as it is on the ceiling side. The blower part 7 can include a filter and a blower such as a fan. The filter can be, for example, a HEPA filter (High Efficiency Particulate Air Filter) or the like.

The controller 9 controls the operation of each element provided in the substrate treatment device 1. FIG. 2 illustrates an example of the configuration of the controller 9. The controller 9 can be, for example, a computer including an computational element such as a CPU (Central Processing Unit) and a memory 9c such as a semiconductor memory. For example, the mechanism controller 9a and the setting part 9b illustrated in FIG. 2 can be used as the computational element, and the memory 9c can be used as the memory element. The memory element can store a control program or the like that controls the operation of each element provided in the substrate treatment device 1. The computational element controls the operation of each element provided in the substrate treatment device 1 by using a control program stored in the memory element, and data input by the operator via the input/output screen (device) 8, and the like.

The data input by the control program and the operator is set to the optimum state for being stored in the memory 9c (memory element) by the setting part 9b, and then stored in the memory element. Further, the setting part 9b reconverts the data requested to be output by the operator to the optimum state for displaying on the input/output screen, and displays the data on the input/output screen (device) 8.

For example, the controller 9 controls the operation of each element provided in the substrate treatment device 1 from the mechanism controller 9a based on the control program stored in the memory 9c, thereby controls rotation of the substrate 100, the supply of the cooling gas 3a1, the supply of the liquid 101, and the supply of the liquid 102.

For example, the controller 9 controls the supply of the cooling gas 3a1, the supply of the liquid 101, and the supply of the liquid 102, and thereby supplies the liquid 102 to the surface 100b of the rotating substrate 100 and performs the preliminary process of supplying the cooling gas 3a1 to the space between the placement stand 2a and the substrate 100.

For example, the controller 9 rotates the substrate 100 to discharge at least a part of the liquid 102 supplied to the surface 100b of the substrate 100, and then changes the rotation speed and supplies the liquid 101 to the surface 100b of the substrate 100 with the discharged liquid 102. The liquid film forming process to form the liquid film is performed.

For example, the controller 9 performs the supercooling process of supercooling the liquid film on the surface 100b of the substrate 100.

For example, the controller 9 performs the freezing process of freezing at least a part of the liquid film on the surface 100b of the substrate 100.

For example, in the process of forming the liquid film, the controller 9 leaves a part of the liquid 102 when it is discharged, and supplies the liquid 101 on the remaining liquid 102.

For example, the controller 9 supplies the liquid 102 to the frozen liquid film and performs the thawing process which thawing the frozen liquid 101.

The details in every processes will be described later.

Next, the operation of the substrate treatment device 1 will be illustrated.

Figure 3:
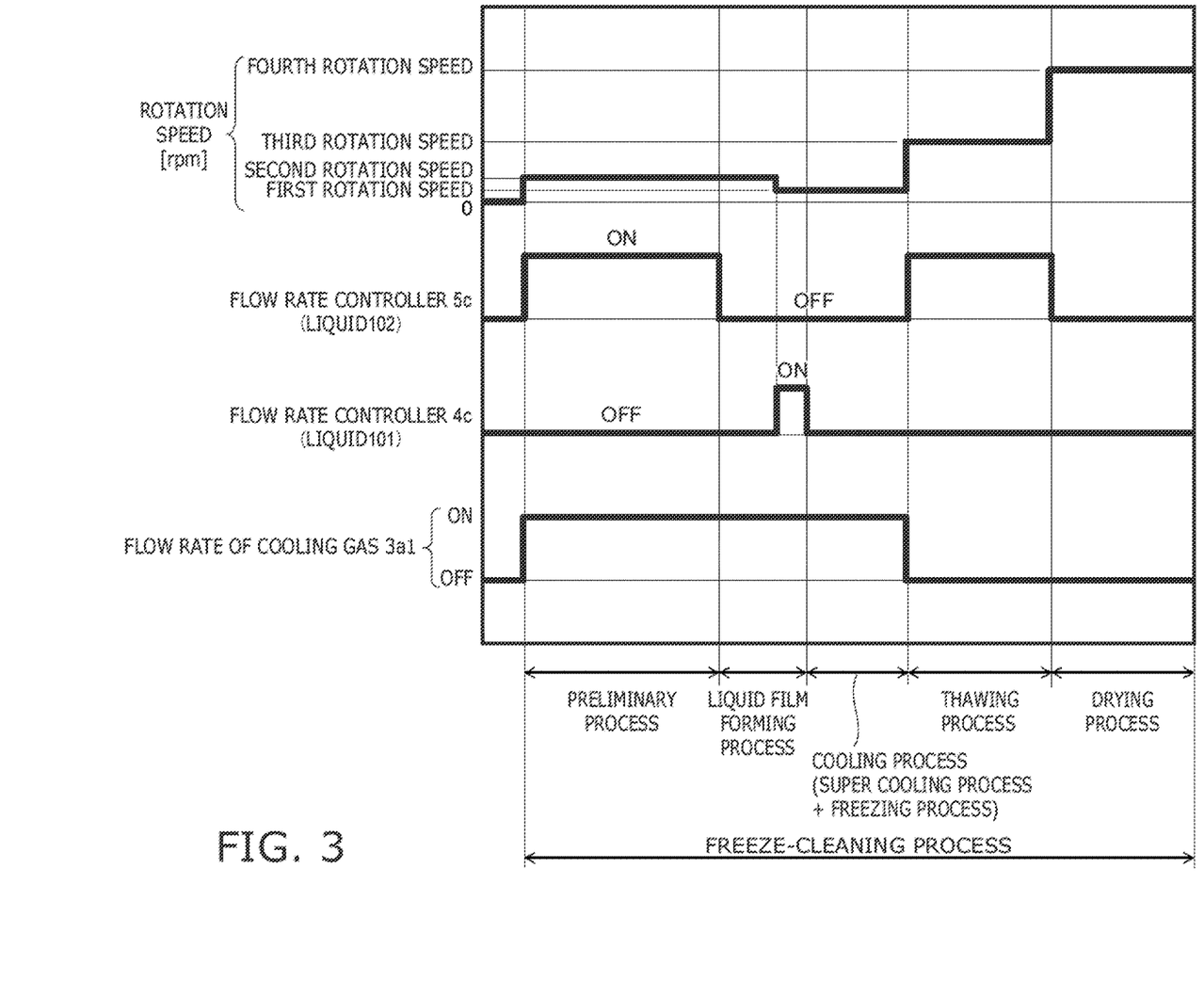
FIG. 3 is a timing chart for illustrating the operation of the substrate treatment device.

FIG. 3 is a timing chart for illustrating the operation of the substrate treatment device 1.

Figure 4:
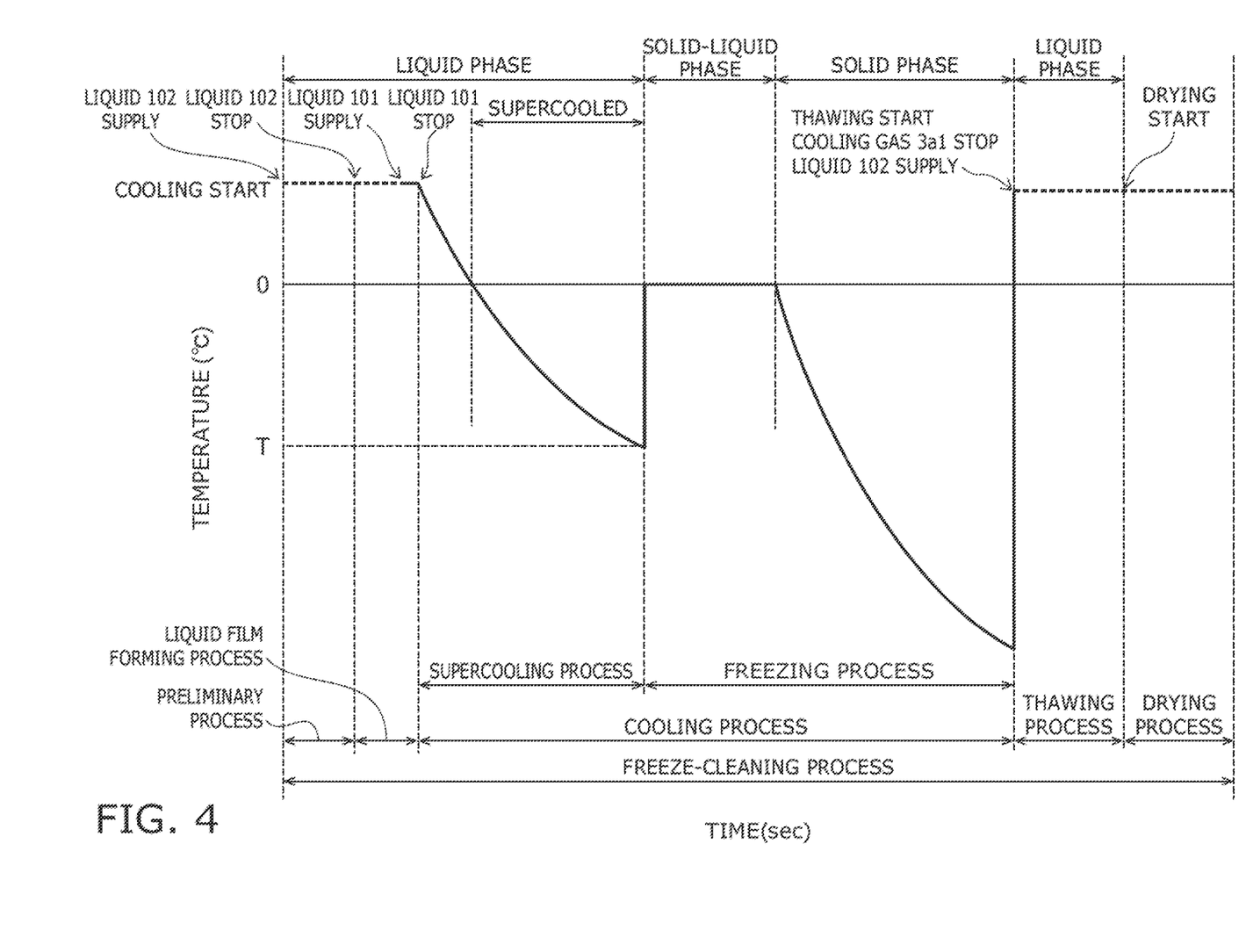
FIG. 4 is a graph for illustrating a temperature change of liquid supplied to the substrate in freeze-cleaning process.

FIG. 4 is a graph for illustrating a temperature change of the liquid 101 supplied to the substrate 100 in the freeze-cleaning process.

FIGS. 3 and 4 show a case where the substrate 100 is a 6025 quartz (Qz) substrate (152 mm×152 mm×6.35 mm), the liquid 101 is pure water, and the liquid 102 is liquid in which carbonic acid gas is dissolved (carbonated water).

First, the substrate 100 is carried into the inside of the housing 6 through a carry-in/carry-out port (not shown) of the housing 6. The carried-in substrate 100 is placed and supported on multiple support portions 2a1 of the placement stand 2a.

After the substrate 100 is supported by the placement stand 2a, a freeze-cleaning process including a preliminary process, a liquid film forming process, a cooling process (supercooling process+freezing process), a thawing process, and a drying process is performed as shown in FIGS. 3 and 4.

First, the preliminary process is performed as shown in FIGS. 3 and 4. In the preliminary process, the controller 9 controls the supplier 5b and the flow rate controller 5c to supply the liquid 102 at a predetermined flow rate to the surface 100b of the substrate 100. Further, the controller 9 controls the flow rate controller 3c to supply the cooling gas 3a1 having a predetermined flow rate to the back surface 100a of the substrate 100. Further, the controller 9 controls the drive part 2c to rotate the substrate 100 at the second rotation speed.

Here, when the atmosphere inside the housing 6 is cooled by the supply of the cooling gas 3a1 by the cooling part 3, frost including dust in the atmosphere may adhere to the substrate 100 and cause contamination. In the preliminary process, since the liquid 102 is continuously supplied to the surface 100b of the substrate 100, it is possible to prevent the frost from adhering to the surface 100b of the substrate 100 while uniformly cooling the substrate 100.

For example, in the case of the one illustrated in FIG. 3, the rotation speed of the substrate 100 can be, for example, about 50 rpm to 500 rpm as the second rotation speed. The flow rate of the liquid 102 can be about 0.1 L/min to 1.0 L/min. The flow rate of the cooling gas 3a1 can be about 40 NL/min to 200 NL/min. In addition, the process time of the preliminary process can be set to about 1800 seconds. The process time of the preliminary process may be any time as long as the in-plane temperature of the substrate 100 becomes substantially uniform, and can be obtained by conducting experiments or simulations in advance.

The temperature of the liquid film in the preliminary process is substantially the same as the temperature of the supplied liquid 102 because the liquid 102 is in a flowing state. For example, when the temperature of the supplied liquid 102 is about room temperature (20° C.), the temperature of the liquid film is about room temperature (20° C.).

Next, the liquid film forming process is performed as shown in FIGS. 3 and 4. In the liquid film forming process, the supply of the liquid 102 supplied in the preliminary process is stopped. Then, since the rotation of the substrate 100 is maintained, the liquid 102 on the surface 100b of the substrate 100 is discharged. Then, the rotation speed of the substrate 100 is reduced to the first rotation speed, which is slower than the second rotation speed. The first rotation speed may be any rotation speed that can suppress the thickness of the liquid film from fluctuating due to centrifugal force, and may be, for example, in the range of 0 to 50 rpm. After the rotation speed of the substrate 100 is set to the first rotation speed, a predetermined amount of liquid 101 is supplied to the substrate 100 to form the liquid film. At this time, the liquid 102 is replaced with the liquid 101. The flow rate of the cooling gas 3a1 is maintained.

The thickness of the liquid film formed in the liquid film forming process (thickness of the liquid film when performing the supercooling process) can be about 200 μm to 1300 μm. For example, the controller 9 controls the supply amount of the liquid 101 to make the thickness of the liquid film on the surface 100b of the substrate 100 about 200 μm to 1300 μm.

Next, as shown in FIGS. 3 and 4, the cooling process (supercooling process+freezing process) is executed. In the embodiment, in the cooling process, the period between the time when the liquid film made of the liquid 101 is in the supercooled state and the time before the freezing starts is called the "supercooling process", and the period between the time when the freezing of the liquid film in the supercooled state is started and the time until the freezing is completely completed is called the "freezing process".

First, in the supercooling process, the temperature of the liquid film on the substrate 100 is further lowered than the temperature of the liquid film in the liquid film forming process due to the cooling gas 3a1 continuously supplied to the back surface 100a of the substrate 100, resulting in supercooled state.

Here, if the cooling rate of the liquid 101 becomes too high, the liquid 101 does not become a supercooled state and freezes immediately. Therefore, the controller 9 controls at least one of the rotation speed of the substrate 100, and the flow rate of the cooling gas 3a1, so that the liquid 101 on the surface 100b of the substrate 100 becomes supercooled.

The control conditions under which the liquid 101 is in the supercooled state are affected by the size of the substrate 100, the viscosity of the liquid 101, the specific heat of the cooling gas 3a1, and the like. Therefore, it is preferable to appropriately determine the control conditions for the liquid 101 to be in the supercooled state by conducting an experiment or a simulation.

In the supercooled state, freezing of the liquid film starts due to, for example, the temperature of the liquid film, the presence of bubbles and contaminations such as particles, and vibration. For example, in the presence of contaminations such as particles, freezing of the liquid film starts when the temperature T of the liquid film becomes not lower than −35° C. and not higher than −20° C. Further, freezing of the liquid film can be started by applying vibration to the liquid film by varying the rotation of the substrate 100.

When freezing of the liquid film in the supercooled state starts, the process shifts from the supercooling process to the freezing process. In the freezing process, at least a part of the liquid film on the surface 100b of the substrate 100 is frozen. In the freeze-cleaning process of the embodiment, the case where the liquid film is completely frozen to become the frozen film 101a will be described.

Next, the thawing process is performed as shown in FIGS. 3 and 4.

In the thawing process, the controller 9 controls the supplier 5b and the flow rate controller 5c to supply the liquid 102 at a predetermined flow rate to the surface 100b of the substrate 100. Further, the controller 9 controls the flow rate controller 3c to stop the supply of the cooling gas 3a1. As a result, the frozen film 101a begins to be thawed, and the frozen film 101a gradually becomes a liquid 101. Further, the controller 9 controls the drive part 2c to increase the rotation speed of the substrate 100 to a third rotation speed faster than the second rotation speed. If the rotation of the substrate 100 becomes faster, the liquids 101 and 102 can be shaken off by centrifugal force. Therefore, the liquids 101 and 102 can be easily discharged from the surface 100b of the substrate 100. At this time, the contaminations separated from the surface 100b of the substrate 100 are also discharged together with the liquids 101 and 102.

The supply amount of the liquid 102 is not particularly limited as long as it can be thawed. Further, the third rotation speed of the substrate 100 is not particularly limited as long as the liquid 101, the frozen liquid 101, the liquid 102, and the contaminations can be discharged.

Next, the drying process is performed as shown in FIGS. 3 and 4. In the drying process, the controller 9 controls the supplier 5b and the flow rate controller 5c to stop the supply of the liquid 102. Further, the controller 9 controls the drive part 2c to further increase the rotation speed of the substrate 100 to a fourth rotation speed faster than the third rotation speed. If the rotation of the substrate 100 becomes faster, the substrate 100 can be dried quickly. The fourth rotation speed of the substrate 100 is not particularly limited as long as the substrate 100 can be dried.

The substrate 100 that has been freeze-cleaned is carried out of the housing 6 through a carry-in/carry-out port (not shown) of the housing 6.

By doing the above, one freeze-cleaning process can be performed.

By the way, as described above, when a liquid having low conductivity (for example, liquid 101) is supplied to the surface 100b of the rotating substrate 100, static electricity is likely to be generated. A conductive pattern or elements insulating the conductive pattern may be formed on the surface 100b of the substrate 100. Therefore, electrostatic breakdown may occur due to the generated static electricity. In addition, the chemical reaction caused by the static electricity may cause damage to the surface of the substrate and the pattern. Even in the case of a substrate (for example, a bulk substrate) before the pattern is provided, the surface 100b of the substrate 100 may be damaged by a chemical reaction caused by static electricity.

A technique is known in which a cleaning liquid having high conductivity in which carbon dioxide is dissolved in pure water is used for spin cleaning of the surface of a substrate against such static electricity. If the cleaning liquid in which carbon dioxide is dissolved in pure water is used, it is possible to suppress the generation of static electricity even if the cleaning liquid is supplied to the surface of the rotating substrate.

Therefore, when the inventors tried the cooling process of the above-mentioned freeze-cleaning process with the liquid 102 which is carbonated water, it was found that the removal ratio is lower than that of the case where the cooling process of the freeze-cleaning process was performed with pure water.

The mechanism of why the removal ratio is lower when the freeze-cleaning process is performed with the liquid 102, which is a conductive liquid, as compared with the case where the freeze-cleaning process is performed with pure water is not always clear, but the mechanism can be thought as follows.

Freezing of the liquid 101 is considered to occur from a contamination such as particles as a base point. If the liquid 101 is frozen with the contamination as a base point, the contamination can be incorporated into the frozen liquid 101. Then, the liquid 101 changes the volume when freezing. As a result, the contaminations that serve the starting points of freezing generate a force that separates the contaminations from the surface of the substrate 100, so that the contaminations can be separated from the surface 100*b* of the substrate 100.

Further, when the liquid 101 changes to a solid, the volume changes, so that a pressure wave is generated. It is considered that the contaminations adhering to the surface 100*b* of the substrate 100 are separated by this pressure wave. The supercooled liquid 101 also has the property that the density change due to the non-uniform temperature of the liquid film, the presence of bubbles and contaminations such as particles, and vibration, etc. are the starting points of freezing. In other words, the starting point for freezing is not limited to contaminations.

By the way, a gas that is ionized when dissolved in the liquid 102 is dissolved in the liquid 102. Therefore, gas bubbles may be included in the liquid 102, or bubbles may be generated in the liquid 102. Further, since SC-1 is a mixed solution of aqueous ammonia and hydrogen peroxide, gas bubbles may be included in the liquid 102, or bubbles may be generated in the liquid 102. As described above, bubbles can also be the starting point for freezing. Therefore, it is considered that if there are bubbles in the liquid 102, the liquid 102 freezes with the bubbles as the base point, making it difficult for the liquid 102 to freeze with the contaminations as the base point.

The inventors have found that in the freeze-cleaning (freezing-cleaning process of the embodiment) in which the liquid is frozen after being supercooled, it is preferable that the liquid to be frozen is a liquid in which bubbles are less likely to be generated.

However, if the freeze-cleaning process is simply performed with a liquid in which bubbles are unlikely to be generated, for example, pure water, the above-mentioned problem of static electricity may occur. Therefore, the inventors have diligently studied the mechanism of generation of static electricity by a liquid having a low conductivity. As a result, it was found that the generation of static electricity is caused by a flow of a liquid having low conductivity, and the generation of static electricity can be suppressed if the liquid is not flowed.

In the freeze-cleaning process of the embodiment, there are a process of flowing the liquid and a process of not flowing the liquid or hardly flowing the liquid. In the process of flowing the liquid, the generation of static electricity is suppressed by using a liquid with high conductivity. In the process of not flowing the liquid or hardly flowing, static electricity is unlikely to be generated. Therefore, even if the conductivity of the liquid is low, it does not lead to pattern damage or substrate damage. Even pure water with low conductivity does not cause any problem. Therefore, even if the liquid film is formed by using a liquid such as pure water that does not include many bubbles, it is possible to maintain a high removal ratio of contaminations while suppressing the generation of static electricity.

In the freeze-cleaning process of the embodiment, in the preliminary process, the conductive liquid 102 is supplied to the surface 100*b* of the substrate 100. In the liquid film forming process, the liquid 102 on the surface 100*b* of the substrate 100 is discharged, after that, the liquid 101 was supplied while rotating the substrate 100 at the first rotation speed to form a liquid film.

By using the liquid 102 in the preliminary process, it is possible to make the in-plane temperature of the substrate 100 substantially uniform while suppressing the generation of static electricity on the surface 100*b* of the substrate 100.

Further, by setting the temperature of the liquid 102 to be higher than the freezing point of the liquid 101, when the liquid 101 is supplied to form the liquid film in the process of forming the liquid film, it is possible to prevent the liquid 101 from freezing before the liquid 101 becomes a supercooled state.

Further, in the process of forming the liquid film, the removal ratio of contaminations can be maintained by supplying the liquid 101 to the surface 100*b* of the substrate 100 to form the liquid film. Since the liquid 101 is a liquid in which bubbles are unlikely to be generated, it is possible to suppress freezing from the bubbles as a base point. Therefore, it becomes easy to cause freezing from the contaminations as a base point, so that the removal ratio of the contaminations can be improved as compared with the case where the liquid 102 is frozen.

Further, in the process of forming the liquid film, if the rotation speed of the substrate 100 is set to be equal to or lower than the first rotation speed, when the liquid 101 is supplied to the surface 100*b* of the substrate 100, friction can be suppressed between the liquid 101 and the surface 100*b* of the substrate 100. Therefore, it is possible to suppress the generation of static electricity. Further, since the influence of the centrifugal force due to the rotation can be suppressed, the supplied liquid 101 spreads on the surface 100*b* of the substrate 100, and a liquid film having a uniform thickness is easily formed. Further, if the rotation of the substrate 100 is stopped, the generation of static electricity and the variation in the thickness of the liquid film due to the centrifugal force can be further suppressed.

Further, in the process of forming the liquid film, the liquid 102 on the surface 100*b* of the substrate 100 may be completely discharged, but the liquid 102 may remain so as to cover the surface 100*b* of the substrate 100. If the conductive liquid 102 remains on the surface 100*b* of the substrate 100, the liquid 101 can be supplied on the conductive liquid 102. By doing so, it is possible to further suppress the generation of static electricity when the liquid 101 is supplied to the surface 100*b* of the substrate 100.

Further, in the process of forming the liquid film, the supply of the cooling gas 3*a*1 is maintained. Therefore, if the conductive liquid 102 remains on the surface 100*b* of the substrate 100, it is possible to prevent frost from being generated on the surface of the substrate 100, and it is also possible to maintain the state in which the in-plane temperature of the substrate 100 is made substantially uniform in the preliminary process.

However, if the residual amount of the liquid 102 is too large, bubbles may be generated in the formed liquid film. Therefore, the thickness of the film of the remaining liquid 102 is preferably 10% or less of the thickness of the liquid film formed in the process of forming the liquid film. If the thickness of the film of the remaining liquid 102 is 10% or less of the thickness of the formed liquid film, even if bubbles are generated, the influence on the removal rate of contaminations can be made very small.

Further, in the following cases, the liquid 101 cannot enter between the substrate 100 and the contaminant(s) in the liquid film forming process, and the liquid 101 may not be possible to separate the contaminant(s) from the surface 100*b* of the substrate 100 in the cooling step.

(1) When the contaminant(s) is/are adsorbed on the surface 100*b* of the substrate 100 because the shape of the contaminant(s) is/are a film.

(2) When the surface 100*b* of the substrate 100 or a contaminant(s) is/are super-water-repellent.

(3) When the surface 100b of the substrate 100 and contaminant(s) is/are super-water-repellent.

In such a case, if the liquid 102 containing the liquid 103 having small surface tension is used in the preliminary process, it is possible to make the liquid 102 containing the liquid 103 intrude between the substrate 100 and the contaminations. If the liquid 102 containing the liquid 103 exists between the substrate 100 and the contaminations, the liquid 101 can intrude between the substrate 100 and the contaminations when the liquid 101 is supplied to the surface 100b of the substrate 100 in the liquid film forming process. Accordingly, the contaminations can be separated from the surface 100b of the substrate 100, even in the above cases (1) to (3). Namely, even in the cases described above, the removal ratio of contaminations can be improved while suppressing static electricity from being generated on the surface 100b of the substrate 100.

Further, in the thawing process, the liquid 102 is supplied to the surface 100b of the substrate 100. As described above, since the liquid 102 has conductivity, it is possible to suppress the generation of static electricity even if the liquid 102 is supplied to the substrate 100 whose rotation speed has been increased.

The freeze-cleaning process may be performed multiple times.

Figure 5:
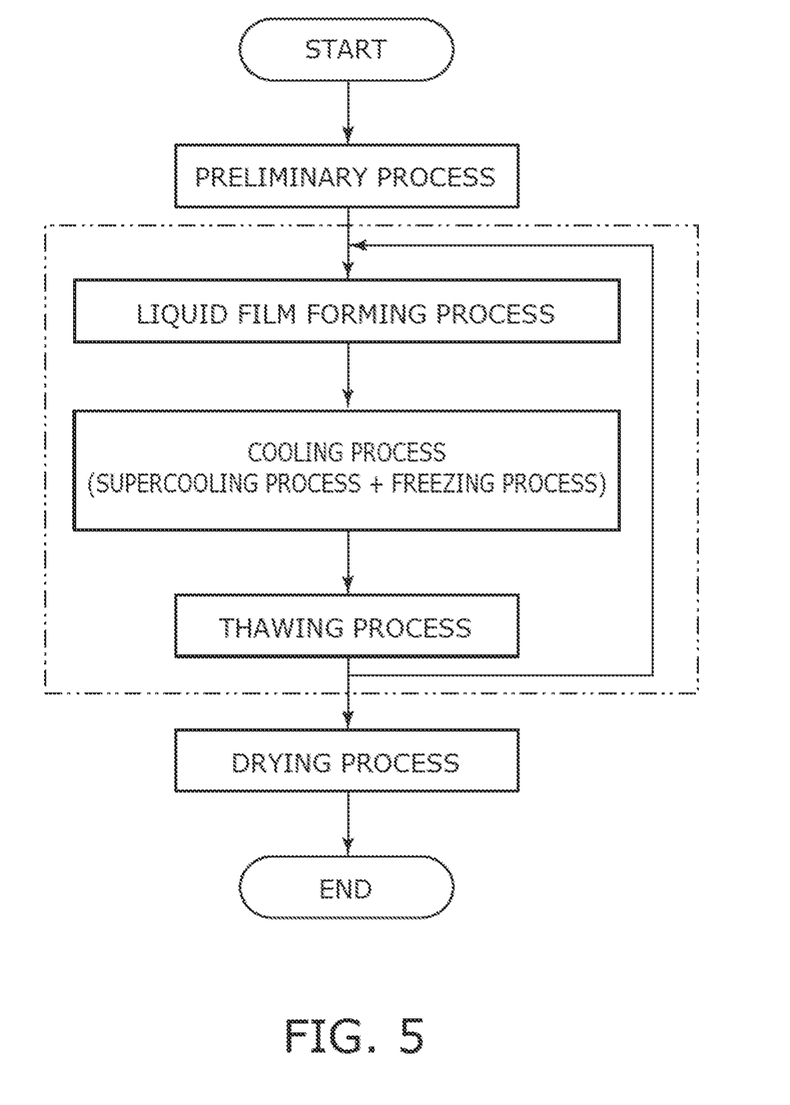
FIG. 5 is a flow chart in the case of performing multiple freeze-cleaning processes.

FIG. 5 is a flowchart in the case of performing multiple freeze-cleaning processes.

As shown in FIG. 5, if the next freeze-cleaning process is performed, it is sufficient to return to the liquid film forming process after performing the thawing process.

The operation of the controller 9 in this case will be described with reference to FIG. 6.

Figure 6:
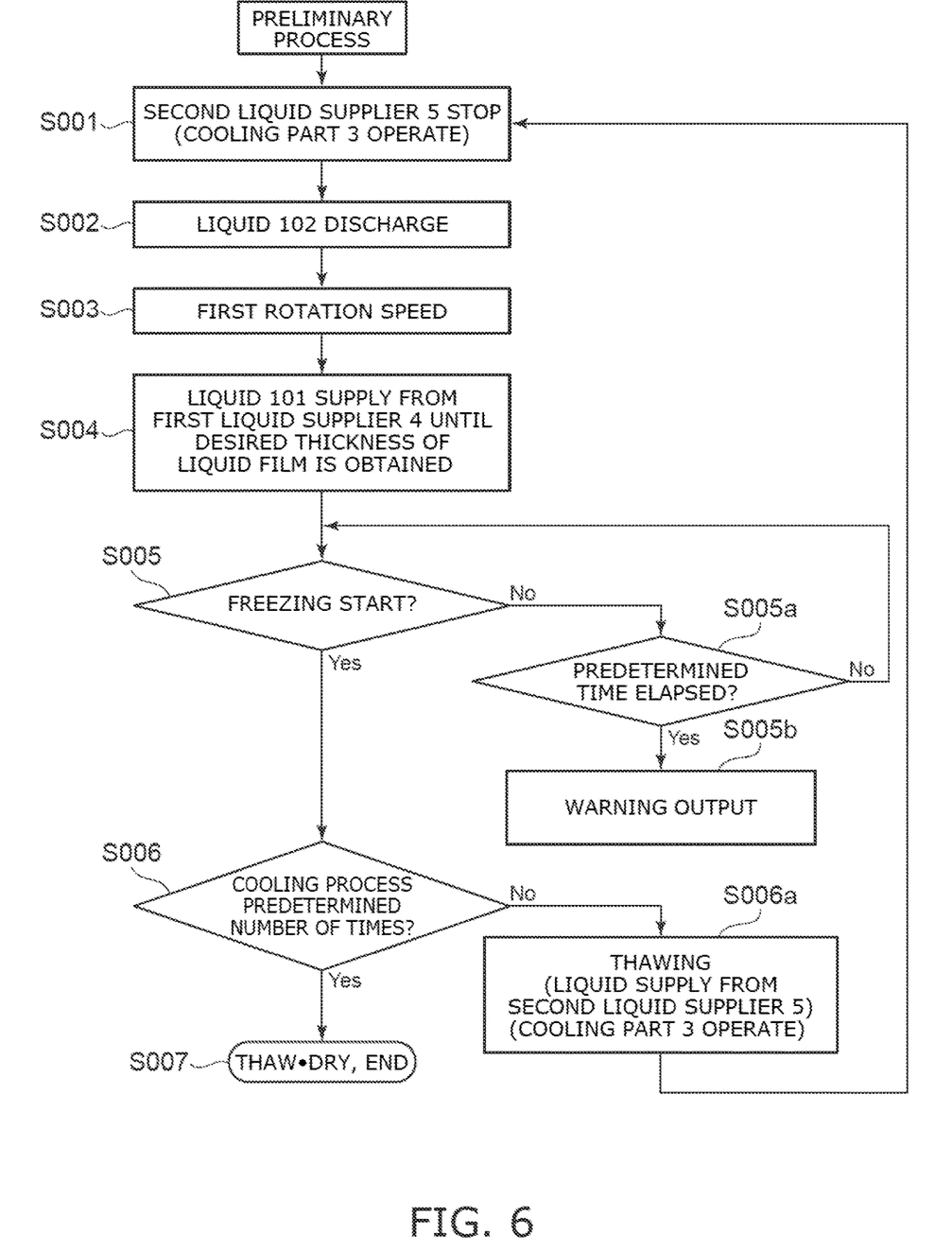
FIG. 6 is a flow chart describing the operation of the controller in the case of performing multiple freeze-cleaning processes.

FIG. 6 is a flowchart illustrating the operation of the controller 9 in the case of performing multiple freeze-cleaning processes.

The number of repetitions of the freeze-cleaning process is stored in advance in the memory 9c by the operator.

As shown in FIG. 6, first, the liquid film forming process (S001 to S004) is performed after performing the preliminary process.

Next, the controller 9 performs the cooling process. In the cooling process, detection data from a detector (not shown) is acquired, and it is determined whether or not the liquid film has frozen (S005). The detection data may be the temperature of the liquid film, or may be the thickness of the liquid film or the cloudiness state of the liquid film. If it is determined that the liquid film has not frozen even after the lapse of a predetermined time, a warning is output and the device is stopped.

When the controller 9 determines that the liquid film has frozen, it determines whether or not the number of repetitions of the predetermined freeze-cleaning process has been reached (S006). If the next freeze-cleaning process is performed, the controller 9 controls the cooling part 3 to maintain the supply of the cooling gas 3a1 even in the thawing process, and controls the second liquid supplier 5 to supply the liquid 102 to the surface 100b of the substrate 100 (S006a). By doing so, the same state as in the preliminary process can be generated. Therefore, as shown in FIG. 5, the preliminary process and the drying process in the next freeze-cleaning process can be omitted.

Therefore, when the multiple freeze-cleaning processes are repeated, the freeze-cleaning process includes at least the liquid film forming process of forming the liquid film having a predetermined thickness on the surface 101b of the substrate 100, the supercooling process of putting a certain liquid film on the surface 101b of the substrate 100 into the supercooled state, the freezing process of freezing at least a part of the liquid film, and the thawing process for thawing the frozen liquid film by supplying the conductive liquid 102 to the frozen film 101a on the surface 100b of the substrate 100.

By doing so, by using the conductive liquid 102 in the thawing process that also serves as the preliminary process, it is possible to suppress the generation of static electricity even if the freeze-cleaning process is repeatedly performed. Further, since the liquid 101 including no bubbles is frozen from the supercooled state, the removal ratio of contaminations can be maintained. As a result, the number of repetitions of the freeze-cleaning process can be reduced, so that the operating rate of the substrate treatment device 1 can be improved.

Figure 7:
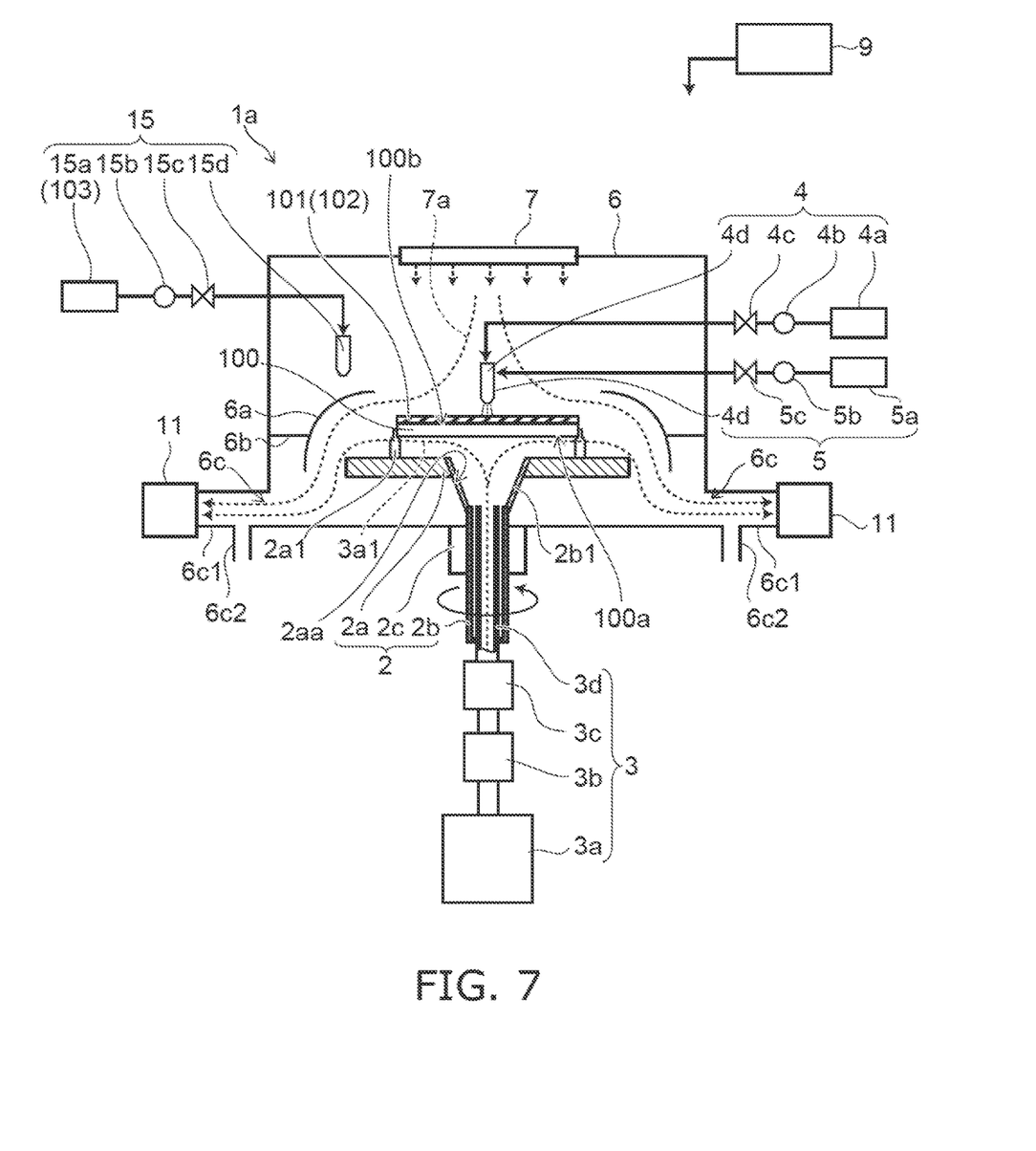
FIG. 7 is a schematic view for illustrating a substrate treatment device according to the other embodiment.

FIG. 7 is a schematic view for illustrating a substrate treatment device 1a according to the other embodiment.

As shown in FIG. 7, the substrate treatment device 1a further includes a third liquid supplier 15. The third liquid supplier 15 supplies the liquid 103 having small surface tension to the surface 100b of the substrate 100. The liquid 103 is, for example, a liquid containing surfactant, isopropyl alcohol (IPA), or the like.

In the case of the substrate treatment device 1 described above, the liquid 102 containing the liquid 103 having small surface tension (a mixed solution) is supplied to the surface 100b of the substrate 100 by the second liquid supplier 5. In contrast, in the case of the substrate treatment device 1a, the liquid 102 is supplied to the surface 100b of the substrate 100 by the second liquid supplier 5, and the liquid 103 is supplied to the surface 100b of the substrate 100 by the third liquid supplier 15, so that the liquid 102 containing the liquid 103 (the mixed solution) is generated on the surface 100b of the substrate 100.

The third liquid supplier 15 includes a liquid storage part 15a, a supplier 15b, a flow rate controller 15c, and a liquid nozzle 15d.

Since the configuration of the third liquid supplier 15 may be, for example, the same as the configuration of the second liquid supplier 5, a description thereof is omitted.

Figure 8:
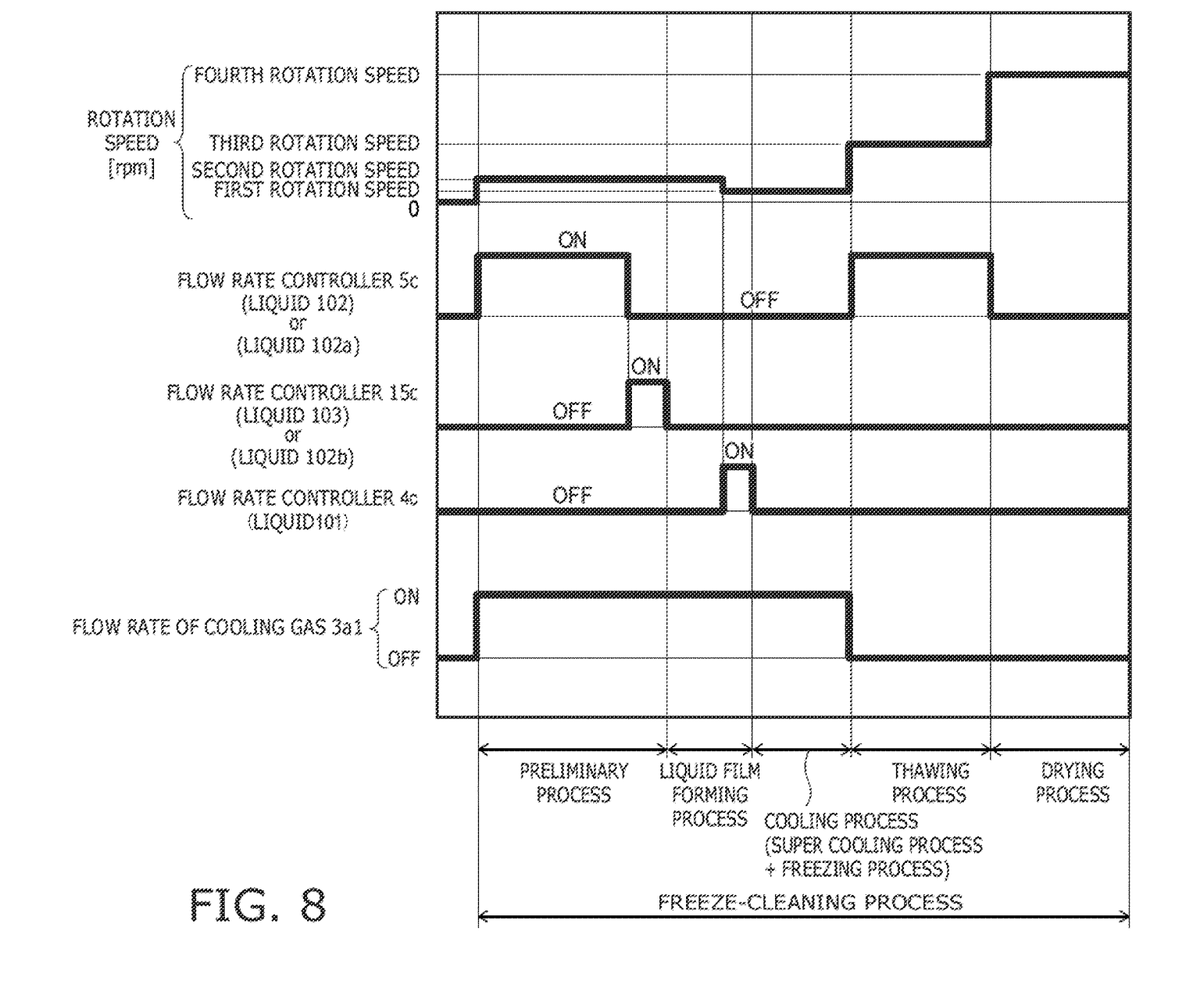
FIG. 8 is a timing chart for illustrating the operation of the substrate treatment device according to the other embodiment.

FIG. 8 is a timing chart for illustrating the operation of the substrate treatment device 1a according to the other embodiment.

The substrate treatment device 1a uses two different types of the liquids 102 and 103 in the preliminary process. For example, at the time of starting the preliminary process, the controller 9 controls the supplier 5b and the flow rate controller 5c to supply, for example, carbonated water (the liquid 102) from the liquid nozzle 4d to the surface 100b of the substrate 100. The control of the cooling gas 3a1 and the control the rotation speed of the substrate are the same as those in the substrate treatment device 1. In this case, the liquid nozzle 15d is moved, by a driver (not shown), to the vicinity of the outer periphery of the substrate 100.

After supplying the carbonated water for a predetermined time, the controller 9 controls the supplier 5b and the flow rate controller 5c to stop the supply of the carbonated water, and the controller 9 controls the supplier 15b and the flow rate controller 15c to supply the liquid 103 having surface tension smaller than the carbonated water from the liquid nozzle 15d. In this case, the controller 9 controls a driver (not shown) to move the liquid nozzle 4d to the vicinity of the outer periphery of the substrate 100, and move the liquid nozzle 15d to a position facing substantially the center of the surface 100b of the substrate 100.

The liquid 103 supplied from the liquid nozzle 15d to the surface 100b of the substrate 100 becomes a mixed solution with the liquid 102 existing on the surface 100b of the substrate 100.

For example, the solution is a mixture of solution A and solution B.

The solution A is at least one of a liquid in which carbon dioxide gas or ammonia gas is dissolved, SC-1 (Standard Clean 1), choline (CHOLINE), and TMAH (Tetramethyl-ammonium) aqueous solution. The solution B is at least one of a liquid which contain surfactant, isopropyl alcohol (IPA).

As described above, if the liquid 102 containing the liquid 103 is used in the preliminary process, the liquid 101 to be frozen easily intrudes between the substrate 100 and the contaminations, even in the above cases (1) to (3).

The conductivity of the liquid 102 containing the liquid 103 is lowered when the mixing ratio of the liquid 103 is higher. Therefore, in the preliminary process, after the carbonated water (the liquid 102) is supplied, the liquid 103 having small surface tension is supplied, and thereby the supply time of the liquid 103 having small surface tension can be reduced. In this case, the time for supplying the carbonated water to the surface 100b of the substrate 100 is preferably longer than the time for supplying the liquid 103. For example, the time for supplying the carbonated water is 300 seconds to 1,500 seconds, and the time for supplying the liquid 103 is 30 seconds to 180 seconds. By doing so, in addition to the operational effect of the embodiment described above, the generation of static electricity on the surface 100b of the substrate 100 can be further suppressed.

After the preliminary process, the controller 9 controls a driver (not shown) to move the liquid nozzle 15d to the vicinity of the outer periphery of the substrate 100 and move the liquid nozzle 4d to a position facing substantially the center of the surface 100b of the substrate 100. Then, the liquid film forming process is performed.

The liquid film forming process is the same as that in the substrate treatment device 1. The carbonated water used in the preliminary process remains in the liquid nozzle 4d and in the pipe. Therefore, while the liquid 103 is being supplied from the liquid nozzle 15d to the surface 100b of the substrate 100, the remaining carbonated water in the liquid nozzle 4d and the pipe is preferably discharged and replaced with the liquid 101.

In the thawing process, the controller 9 controls the supplier 5b and the flow rate controller 5c to supply the carbonated water (the liquid 102) at a predetermined flow rate to the surface 100b of the substrate 100. The control of the cooling gas and the control of the rotation speed of the substrate are the same as those in the substrate treatment device 1. Also, the drying process is the same as that in the substrate treatment device 1.

A liquid 102a that is a conductive liquid and is nonreactive to the substrate 100 may be supplied from the second liquid supplier 4 to the surface 100b of the substrate 100, and a liquid 102b that is a conductive liquid and has small surface tension may be supplied from the third liquid supplier 15 to the surface 100b of the substrate 100.

The liquid 102a is, for example, carbonated water or a mixed solution of carbonated water and the liquid 103.

The liquid 102b is, for example, SC-1 (Standard Clean 1) having a low concentration, choline (CHOLINE) aqueous solution, TMAH (Tetramethyl ammonium hydroxide) aqueous solution, or a mixed solution of these solutions and the liquid 103.

The liquid 102b is a conductive liquid and is also a liquid having small surface tension. Therefore, by using the liquid 102b, the effect can be obtained that suppresses static electricity from being generated on the surface 100b of the substrate 100 and also enables the liquid 101 to easily intrude between the substrate 100 and the contaminations. However, the liquid 102b may etch the surface 100b of the substrate 100.

Therefore, in the preliminary process, by supplying the liquid 102b after supplying the carbonated water (the liquid 102a), the supply time of the liquid 102b that may etch the surface 100b of the substrate 100 can be reduced. In this case, the time for supplying the carbonated water to the surface 100b of the substrate 100 is preferably longer than the time for supplying the liquid 102b. For example, the time for supplying the carbonated water is 300 seconds to 1,500 seconds, and the time for supplying the liquid 102b is 30 seconds to 180 seconds.

By doing so, in addition to the operational effect of the embodiment described above, the following effect can be obtained. That is, the removal ratio of contaminations can be further improved while suppressing the surface 100b of the substrate 100 from being etched, even in the case where the contaminations are adsorbed on the surface 100b of the substrate 100, in the case where the surface 100b of the substrate 100 or the contaminations is/are super-water-repellent, or in the case where the surface 100b of the substrate 100 and the contaminations are super-water-repellent.

In this case, the liquid film forming process, the thawing process and the drying process are similarly performed as the substrate treatment device 1. In the thawing process, the liquid 102a may be used or the liquid 102b may be used.

The embodiments have been described. However, the invention is not limited to these descriptions. For example, any addition, deletion, or design change of components, or any addition, omission, or condition change of processes in the above embodiments suitably made by those skilled in the art are also encompassed within the scope of the invention as long as they fall within the spirit of the invention.

For example, the shape, size, number, arrangement, and the like of each component included in the substrate treatment device 1 are not limited to those illustrated, and can be appropriately changed.

For example, in the preliminary process, it is not always necessary to rotate the substrate at the second rotation speed, and the substrate may be rotated at the first rotation speed or less. In this case, immediately before shifting to the liquid film forming process, at least a part of the liquid 102 may be discharged with the rotation speed as the second rotation speed.

Further, in the thawing process, the start of thawing does not necessarily have to be performed on the frozen film 101a. For example, thawing may be started in a state where the liquid 101 is partially frozen from the supercooled state (solid-liquid phase state).

What is claimed is:
1. A substrate treatment device, comprising:
a placement stand configured to rotate the substrate, the substrate including a first surface and a second surface opposite the first surface, the first surface facing the placement stand;
a cooling part configured to supply a cooling gas into a space between the placement stand and the substrate;
a first liquid supplier configured to supply a first liquid on the second surface of the substrate;
a second liquid supplier configured to supply a second liquid on the second surface of the substrate, the second liquid being more conductive than the first liquid; and a controller controlling rotation of the substrate, supply of the cooling gas, supply of the first liquid, and supply of the second liquid, the controller being configured to perform following steps;

a preliminary step of supplying the second liquid on the second surface of the substrate, a temperature of the second liquid being higher than a freezing point of the first liquid, and supplying the cooling gas into the space between the placement stand and the substrate,     a liquid film forming step of forming a liquid film by supplying the first liquid toward the second surface of the substrate after the preliminary step,     a supercooling step of putting the liquid film on the second surface of the substrate in a supercooled state, and     a freezing step of freezing at least a part of the liquid film on the second surface of the substrate, in the liquid film forming step, after stopping the supply of the second liquid, rotating the substrate at a rotational speed of the preliminary step to discharge at least a part of the second liquid supplied to the second surface of the substrate, after discharging at least part of the second liquid, setting a first rotational speed slower than the rotational speed in the preliminary step, and then supplying the first liquid toward the second surface of the substrate, and in the freezing step, the liquid film has a layer comprising only the first liquid if the second liquid is completely discharged in the liquid film forming step, or the liquid film has a layer comprising the first liquid and the second liquid if a part of the second liquid is left in the liquid film forming step.

2. The device according to claim 1, wherein the controller further performs a thawing process of thawing the frozen liquid film by supplying the second liquid to the frozen liquid film on the second surface of the substrate.

3. The device according to claim 1, wherein the second liquid contains a gas that is ionized when dissolved therein.

4. The device according to claim 3, wherein the gas that is ionized is carbon dioxide gas or ammonia gas.

5. The device according to claim 4, wherein the second liquid is water in which the gas is dissolved.

6. The device according to claim 5, wherein the first liquid is pure water.

7. The device according to claim 1, wherein the second liquid supplier includes a nozzle discharging the second liquid, and a discharge port of the second liquid of the nozzle faces a center of the second surface of the substrate.

8. The device according to claim 7, wherein the first liquid supplier supplies the first liquid to the second surface of the substrate by using the nozzle included in the second liquid supplier.

\* \* \* \* \*